United States Patent
Abe

(10) Patent No.: US 9,059,036 B2
(45) Date of Patent: Jun. 16, 2015

(54) SEMICONDUCTOR INTEGRATED CIRCUIT INCLUDING MEMORY CELLS

(75) Inventor: Kazuhiro Abe, Funabashi (JP)

(73) Assignee: FUJITSU LIMITED, Kawasaki (JP)

( * ) Notice: Subject to any disclaimer, the term of this patent is extended or adjusted under 35 U.S.C. 154(b) by 260 days.

(21) Appl. No.: 13/469,158

(22) Filed: May 11, 2012

(65) Prior Publication Data
US 2012/0313185 A1 Dec. 13, 2012

(30) Foreign Application Priority Data
Jun. 10, 2011 (JP) .................. 2011-130683

(51) Int. Cl.
*H01L 21/70* (2006.01)
*H01L 27/118* (2006.01)
*H01L 27/02* (2006.01)

(52) U.S. Cl.
CPC ...... *H01L 27/11807* (2013.01); *H01L 27/0207* (2013.01)

(58) Field of Classification Search
CPC ...... H01L 27/088; H01L 27/11; H01L 27/112
USPC .......... 257/390, 379, 206, E27.009; 438/129; 716/100
See application file for complete search history.

(56) References Cited

U.S. PATENT DOCUMENTS

| | | | |
|---|---|---|---|
| 6,100,550 A * | 8/2000 | Hidaka ................. | 257/210 |
| 6,909,135 B2 | 6/2005 | Nii et al. | |
| 8,169,037 B2 | 5/2012 | Furuta et al. | |
| 2006/0164130 A1 | 7/2006 | Yoshida | |
| 2009/0045840 A1 * | 2/2009 | Beckenbaugh et al. ........ | 326/45 |
| 2009/0045841 A1 * | 2/2009 | Beckenbaugh et al. ........ | 326/45 |

FOREIGN PATENT DOCUMENTS

| | | |
|---|---|---|
| JP | 2002-353413 | 12/2002 |
| JP | 2006-196841 | 7/2006 |
| JP | 2010-004019 | 1/2010 |

OTHER PUBLICATIONS

Japanese Office Action mailed Sep. 30, 2014 for corresponding Japanese Patent Application No. 2011-130683, with Partial English Translation, 3 pages.

* cited by examiner

*Primary Examiner* — Jamie C Niesz
(74) *Attorney, Agent, or Firm* — Fujitsu Patent Center

(57) ABSTRACT

A semiconductor integrated circuit includes a plurality of memory cells arranged in a cell-placement row extending in a first direction, a first N well and a first P well arranged in a second direction perpendicular to the first direction in each area of the memory cells, and a second N well and a second P well each having the same length as a width of the cell-placement row and situated between at least two adjacent memory cells of the plurality of memory cells, wherein the first N well and the second N well are integrated, and the first P well and the second P well are integrated.

10 Claims, 14 Drawing Sheets

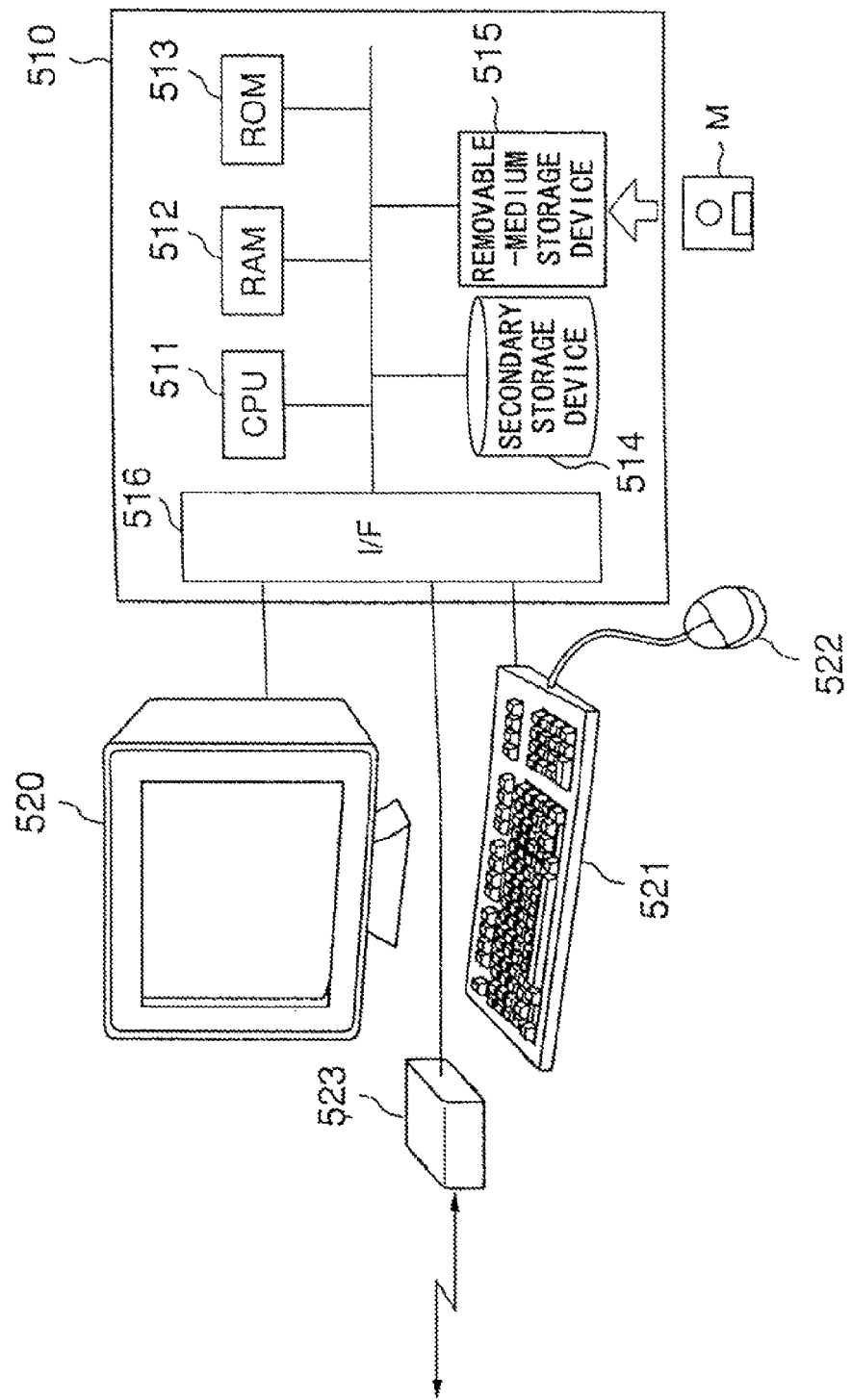

SEMICONDUCTOR INTEGRATED CIRCUIT INCLUDING MEMORY CELLS

CROSS-REFERENCE TO RELATED APPLICATIONS

The present application is based upon and claims the benefit of priority from the prior Japanese Patent Application No. 2011-130683 filed on Jun. 10, 2011, with the Japanese Patent Office, the entire contents of which are incorporated herein by reference.

FIELD

The disclosures herein relate to cell placement, a semiconductor circuit, and a method of placing circuit element cells.

BACKGROUND

In cell-based design, various types of logic cells that are designed in advance and registered as libraries are combined to design an LSI (large-scale integrated) circuit. Logic cells prepared in advance are called standard cells, which may include basic circuit gates and more complex logic circuits such as flip flops. Cells incorporated in cell-based design may also include macro-cells or the like defining larger-scale circuits such as a ROM, a RAM, and an AD converter.

FIG. 1 is a drawing illustrating a standard-cell-placement area used in cell-based design. In a standard-cell-placement area 10, Vdd lines 12 for supplying a power supply potential Vdd and Gnd lines 13 for supplying a ground potential Gnd are arranged alternately at constant intervals. An area between a Vdd line 12 and an adjacent Gnd line 13 constitutes a cell-placement row 11 having a constant height (and width). Each cell-placement row 11 has an N well 14 and a P well 15 formed therein that extend in the same direction as the direction in which the cell-placement row 11 extends. The N well 14 is electrically connected to the corresponding Vdd line 12 through a contact, and the P well 15 is electrically connected to the corresponding Gnd line 13 through a contact.

In an example illustrated in FIG. 1, a standard cell 16 has the same height as the cell-placement row 11, and a standard cell 17 has a height twice as large as the cell-placement row 11. In this manner, the height of a standard cell is restricted to the same height as the cell-placement row 11 or an integer multiple of the height of the cell-placement row 11. This ensures that an orderly cell arrangement is naturally obtained upon placing a plurality of standard cells, thereby simplifying the task of placing cells.

A general standard cell includes one or more P-channel-type transistors (i.e., PMOS transistors) and one or more N-channel-type transistors (i.e., NMOS transistors). PMOS transistors are formed in the N well 14, and NMOS transistors are formed in the P well 15. As was previously described, the N well 14 is connected to the corresponding Vdd line 12. Because of this, it is preferable for the N well 14 to extend along and in parallel to the Vdd line 12 (i.e., in parallel to the cell-placement row 11). Similarly, the P well 15 is connected to the corresponding Gnd line 13. Because of this, it is preferable for the P well 15 to extend along and in parallel to the Gnd line 13 (i.e., in parallel to the cell-placement row 11). Further, with a premise that the N well 14 and the P well 15 are formed in parallel to the cell-placement row 11 as illustrated in FIG. 1, a standard cell that is designed based upon this premise can be placed anywhere in the cell-placement row 11 without modifying the design of the wells. In this manner, a standard cell is typically designed based upon a premise that the N well 14 and the P well 15 are formed in parallel to the cell-placement row 11 as illustrated in FIG. 1.

FIG. 2 is a drawing illustrating a configuration in which a plurality of latches for storing a plurality of bits are arranged in line on the cell-placement row. In FIG. 2, six latches 20, each of which is a standard cell, are arranged in the cell-placement row 11 without having any gaps therebetween. The six latches 20 can store 6 bit data. One of the six latches 20 may store a parity bit that is generated from the 5-bit data stored in the five remaining latches 20. Nine latches 20 may be arranged instead of six latches. Such nine latches can store one-byte data and one parity bit.

As the size of semiconductor elements such as transistors is reduced, a critical charge amount (i.e., the amount of electric charge needed to invert stored data) decreases because of reduction in the power supply voltage and internal capacitance of a memory element such as a latch. This results in an increase in the probability of soft error by which stored data is inverted due to an arrival of α ray or neutron ray. Entry of α ray into an N well or P well, for example, results in a large number of electron-hole pairs being generated in the well. These electron-hole pairs are then scattered in every direction within the well. Electrons generated by an arrival of α ray into an N well tend to be collected by Vdd since the N well is coupled to the power supply potential Vdd. Also, electrons are the majority carrier in the N well. Because of this, these electrons have little effect on P-type diffusion regions existing in the N well. Holes generated together with these electrons, however, end up changing the potential of the P-type diffusion regions existing in the N well upon being collected by these regions. Especially when the P-type diffusion regions are coupled to the ground voltage Gnd, the above-noted change occurs as a change toward higher potentials, thereby causing soft error. Holes generated by an arrival of α ray into a P well tend to be collected by Gnd since the P well is coupled to the ground potential Gnd. Also, holes are the majority carrier in the P well. Because of this, these holes have little effect on N-type diffusion regions existing in the P well. Electrons generated together with these holes, however, end up changing the potential of the N-type diffusion regions existing in the P well upon being collected by these regions. Especially when the N-type diffusion regions are coupled to the ground voltage Gnd, the above-noted change occurs as a change toward lower potentials, thereby causing soft error.

When latches are formed in the common N well 14 and P well 15 as illustrated in FIG. 2, electrons and holes generated by an arrival of α ray into a well are scattered in the well, thereby causing soft error in the plurality of latches in some cases. An error occurring only with respect to one bit among the plurality of bits stored in the latches 20 can be detected by a parity check. Further, the use of a mechanism for correcting error by use of error correction code makes it possible to detect and correct an error in the case of one-bit error. However, errors occurring with respect to two bits among the plurality of bits stored in the latches 20 cannot be correctly detected by a parity check. Further, the mechanism for correcting error by use of error correction code can detect two-bit errors, but cannot correct these errors. Moreover, errors occurring with respect to three or more bits cannot be correctly detected even by use of error correction codes. Occurrence of errors in a plurality of bits may thus result in a performance drop due to a need for an extra action such as an instruction retry, or may result in a failure to perform correct circuit operations.

Measures for preventing soft error may be taken as follows. The number of transistors may be increased and a new latch structure may be devised such as in the case of DICE (i.e., Dual Interlocked Storage Cell), for example, thereby increasing a tolerance level of a latch against soft error. Also, the size of transistors in a latch may be increased to increase the critical charge amount, thereby increasing a tolerance level of the latch against soft error. Moreover, the distance between adjacent latches for storing adjacent bits may be increased to reduce the possibility of electrons reaching the adjacent bit upon being generated by an arrival of α ray. Further, a dummy P-well region (or N-well region) may be provided on a memory-cell border in the common N-type well region (or P-type well region) shared by adjacent memory cells as disclosed in Patent Document 1, thereby reducing soft error.

In cell-based design, however, the above-noted methods of increasing a soft-error tolerance level are faced with problems as follows. Devising a latch structure such as a DICE latch or increasing a critical charge amount by enlarging transistor size give rise to a problem in that power consumption and circuit size significantly increase. Further, an increase in the soft-error tolerance of a latch does not completely remove the possibility of soft error. When error occurs, therefore, plural bits may suffer errors if a common well region is used as in the previously-described cell-based design. An increase in the distance between adjacent latches for storing adjacent bits also gives rise to a problem of a size increase. If the distance is not sufficiently increased due to consideration to the problem of a size increase, the possibility of plural bit errors is not sufficiently lowered.

If the configuration in which a dummy well region is provided between adjacent memory cells as disclosed in Patent Document 1 is applied to the well structure illustrated in FIG. 2, N wells and P wells end up being arranged in a checkerboard pattern. Namely, dummy P-well regions are inserted into the N well 14 between adjacent latches 20 illustrated in FIG. 2, and, also, dummy N-well regions are inserted into the P well 15 between adjacent latches 20, so that the dummy P-well regions and the dummy N-well regions are opposed to each other. Each dummy well region is isolated, and needs to satisfy the minimum size requirement of a well as defined by the process used. This requirement causes the size of a dummy well region to be relatively large. The fact that each well region is isolated also gives rise to a problem in that an area for coupling each well to the corresponding potential may need to be newly provided. Moreover, an actual process involves manufacturing error. Because of this, the same-conduction-type wells may be connected to each other in a diagonal direction at the corners of wells. It may thus be the case that the wells cannot be completely separated from each other between adjacent latches 20.

[Patent Document 1] Japanese Patent Application Publication No. 2002-353413

[Patent Document 2] Japanese Patent Application Publication No. 2010-4019

SUMMARY

According to an aspect of the embodiment, a semiconductor integrated circuit includes a plurality of memory cells arranged in a cell-placement row extending in a first direction, a first N well and a first P well arranged in a second direction perpendicular to the first direction in each area of the memory cells, and a second N well and a second P well each having the same length as a width of the cell-placement row and situated between at least two adjacent memory cells of the plurality of memory cells, wherein the first N well and the second N well are integrated, and the first P well and the second P well are integrated.

According to another aspect of the embodiment, a semiconductor integrated circuit includes a plurality of memory elements arranged in a cell-placement row extending in a first direction and formed in a first N well and a first P well arranged in a second direction perpendicular to the first direction, and a second N well and a second P well each having the same length as a width of the cell-placement row and situated between at least two adjacent memory elements of the plurality of memory elements, wherein the first N well and the second N well are integrated, and the first P well and the second P well are integrated, and wherein the plurality of memory elements store respective bits of one data item.

According to another aspect of the embodiment, a method of placing circuit element cells by use of a computer includes placing a plurality of memory cells in a cell-placement row extending in a first direction, the plurality of memory cells being formed in a first N well and a first P well arranged in a second direction perpendicular to the first direction, and placing, between at least two adjacent memory cells of the plurality of memory cells, a cell including a second N well and a second P well each having the same length as a width of the cell-placement row.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 15 is a drawing illustrating the configuration of an apparatus for performing the method of placing circuit element cells.

DESCRIPTION OF EMBODIMENTS

In the following, embodiments of the invention will be described with reference to the accompanying drawings.

Figure 3:
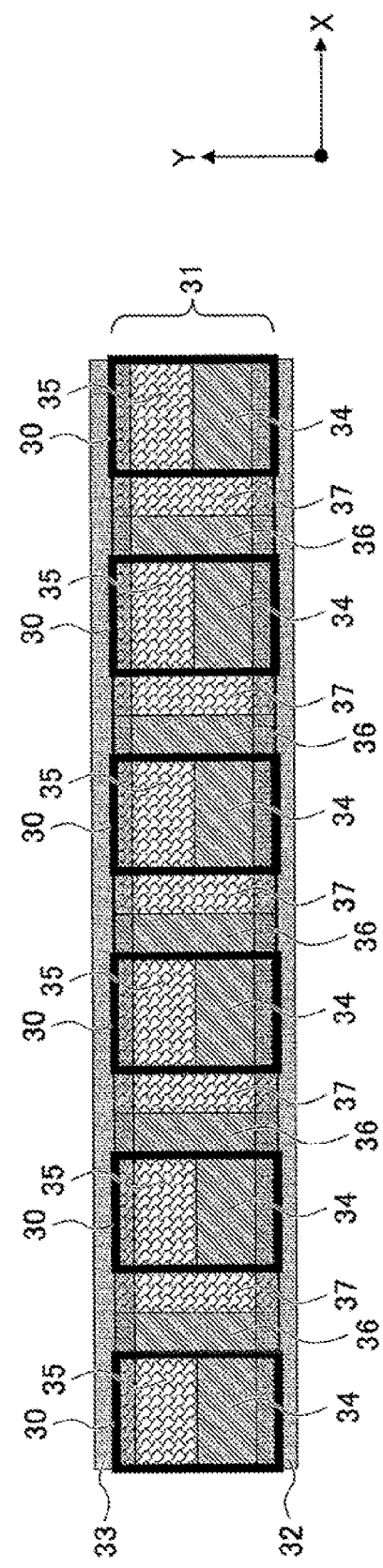
FIG. 3 is a drawing illustrating an example of the placement structure of circuit element cells.

FIG. 3 is a drawing illustrating an example of the placement structure of circuit element cells. In the placement structure of circuit element cells illustrated in FIG. 3, a plurality of memory cells 30 are arranged in a cell-placement row 31 that extends in a first direction (i.e., X direction in FIG. 3). Although six memory cells 30 are arranged as an example in FIG. 3, the number of memory cells 30 may be any number. The cell-placement row 31 is an area between a Vdd line 32 and a Gnd line 33, and has a constant height (and width). In the area of each memory cell 30, a first N well 34 and a first P well 35 are arranged in a second direction (i.e., Y direction in FIG. 3) perpendicular to the first direction. Between at least two adjacent memory cells of the plurality of memory cells 30, a second N well 36 and a second P well 37 each having the same length as the width of the cell-placement row 31 are inserted. The first N well 34 and the second N well 36 illustrated as being adjacent to each other constitute an integrated, unitary, continuous well region. The first P well 35 and the second P well 37 illustrated as being adjacent to each other constitute an integrated, unitary, continuous well region. Each of the N well 36 and the P well 37 may have a slit shape having a length in the Y direction that is substantially longer than its width in the X direction.

In the example illustrated in FIG. 3, the N well 36 and the P well 37 forming a pair are arranged in such a positional relationship that the N well 36 is situated to the left-hand side of the figure and the P well 37 is situated to the right-hand side of the figure. The arrangement of the N well 36 and the P well 37 is not limited to this example. The N well 36 and the P well 37 forming a pair are arranged in such a positional relationship that the N well 36 is situated to the right-hand side of the figure and the P well 37 is situated to the left-hand side of the figure. The N well 36 and the P well 37 forming a pair arranged in such a positional relationship that the N well 36 is situated to the left-hand side of the figure and the P well 37 is situated to the right-hand side of the figure may be used together with the N well 36 and the P well 37 forming a pair arranged in such a positional relationship that the N well 36 is situated to the right-hand side of the figure and the P well 37 is situated to the left-hand side of the figure. As will be described later, the N well 36 may have a potential contact part for coupling the N well 34 and 36 to the Vdd potential. Similarly, the P well 37 may have a potential contact part for coupling the P well 35 and 37 to the Gnd potential.

In a semiconductor integrated circuit having the placement structure of circuit element cells as described above, the memory cells 30 may store respective bits which constitute a single data item. Data stored in at least one of the memory cells 30 may be a value obtained from the data stored in the remaining memory cells 30. For example, one bit stored in one of the memory cells 30 may be a parity bit obtained from the five bits stored in the five remaining memory cells 30. Alternatively, one or more bits stored in at least one of the memory cells 30 may be one or more redundant bits for error correction obtained from the bits stored in the remaining memory cells 30.

In the cell placement structure illustrated in FIG. 3, the wells of adjacent memory cells 30 are separated from each other by a well of a different conduction type. Namely, the N wells 34 of adjacent memory cells 30 are separated from each other by the P well 37. Also, the P wells 35 of adjacent memory cells 30 are separated from each other by the N well 36. With this structure, wells are isolated from each other between adjacent memory cells 30, making it difficult for soft error to propagate to an adjacent bit. To be specific, the P well 35 and 37 is coupled to the ground potential Gnd, and the N well 34 and 36 is coupled to the power supply potential Vdd, so that they are placed in a reverse bias condition. Because of this, a depleted layer is created around the border between the P well and the N well, which prevents electrons from propagating from the P well to the N well, and also prevents holes from propagating from the N well to the P well. In this manner, the border between wells serves as a barrier. Accordingly, charges generated by entry of α ray into a memory cell 30 are prevented from moving by barriers around the borders between wells. This reduces an effect on the adjacent memory cells 30.

In the cell placement structure illustrated in FIG. 3, the N well 36 is continuous with the N well 34, and the P well 37 is continuous with the P well 35. Because of this, the N well 36 or the P well 37 alone does not have to satisfy the minimum size requirement of a well. It suffices for the combined N well 34 and 36 or the combined P well 35 and 37 as a whole to satisfy the minimum size requirement of a well. The size of the N well 36 and the P well 37 can thus be reduced. Further, there is no point at which corners of wells of the same conduction type meet each other as in the case of a checkerboard pattern. This can avoid unintentional coupling between wells that are supposed to be separated from each other.

Figure 1:
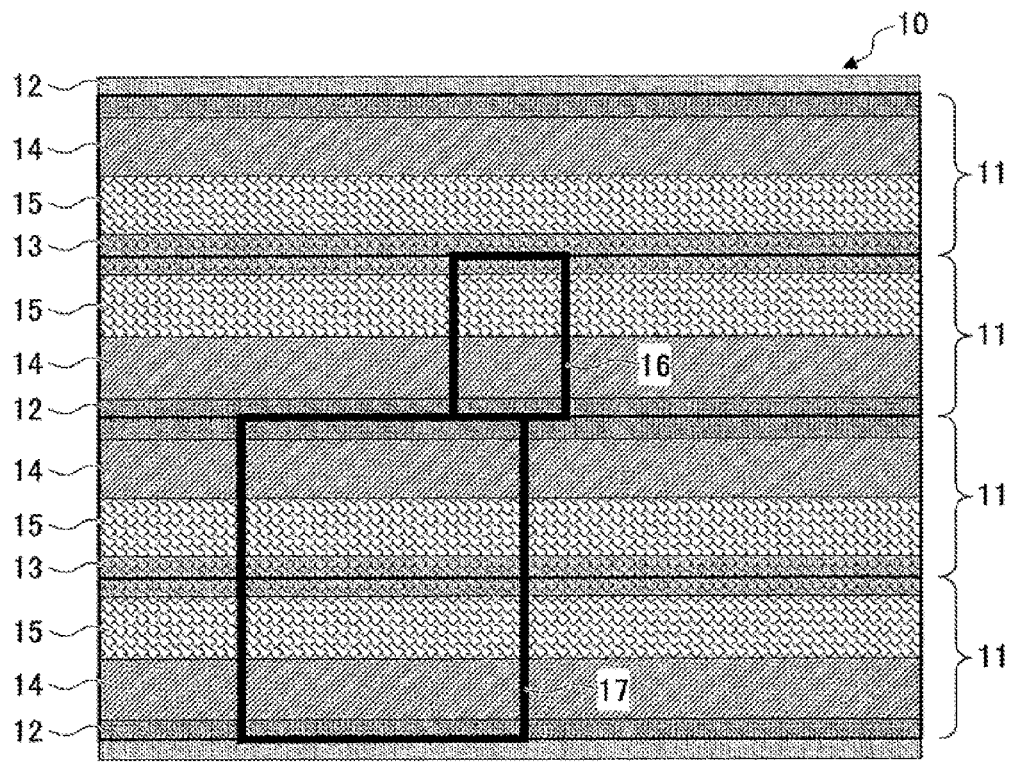
FIG. 1 is a drawing illustrating a standard-cell-placement area used in cell-based design.

In the cell placement structure illustrated in FIG. 3, further, the N well 34 and the P well 35 are arranged in the width direction of the cell placement row (i.e., in the Y direction) as in the case of the standard placement area used in cell-based design illustrated in FIG. 1. Accordingly, standard cells having the same design as conventional standard cells used in the cell-based design illustrated in FIG. 1 can be used to design the cell placement structure illustrated in FIG. 3 according to cell-based design. Namely, the design of existing standard cells can be used without any modification, thereby achieving utilization of existing resources, for the purpose of suppressing soft errors occurring in a plurality of bits.

Figure 4:
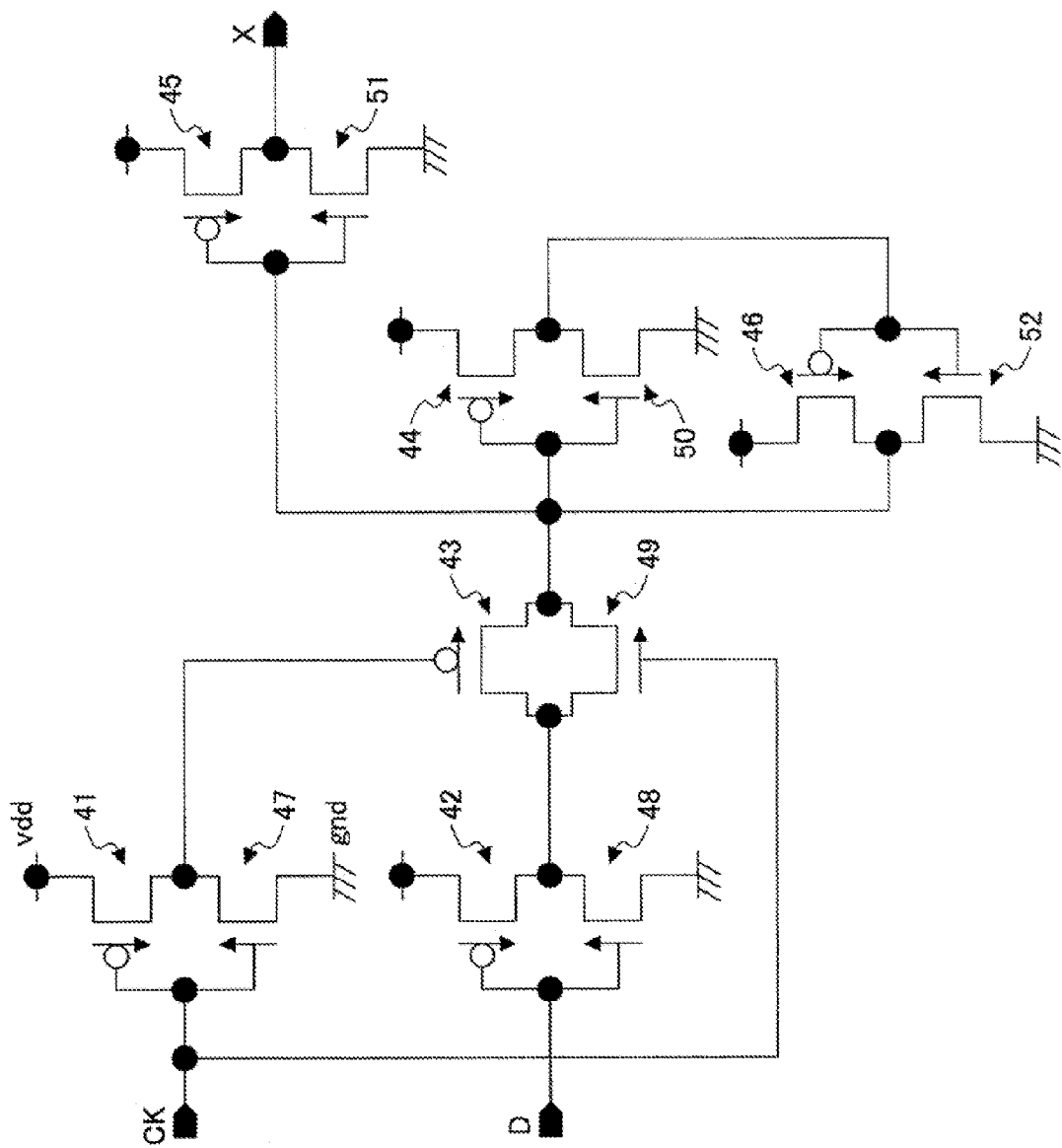
FIG. 4 is a drawing illustrating an example of the circuit configuration of a latch serving as a memory cell.

FIG. 4 is a drawing illustrating an example of the circuit configuration of a latch serving as a memory cell 30. A latch illustrated in FIG. 4 includes PMOS transistors 41 through 46 and NMOS transistors 47 through 52. An inverter including the PMOS transistor 44 and the NMOS transistor 50 and an inverter including the PMOS transistor 46 and the NMOS transistor 52 are connected to each other such that the output of any given inverter is coupled to the input of the other inverter, thereby forming a latch circuit. In response to a clock signal applied to a clock terminal CK, a transmission gate including the PMOS transistor 43 and the NMOS transistor 49 is opened and closed. At the timing at which the transmission gate is opened, data applied to a data terminal D is latched by the above-noted latch circuit. The data latched by the latch circuit is output from an output terminal X through an output driver including the PMOS transistor 45 and the NMOS transistor 51.

Figure 5:
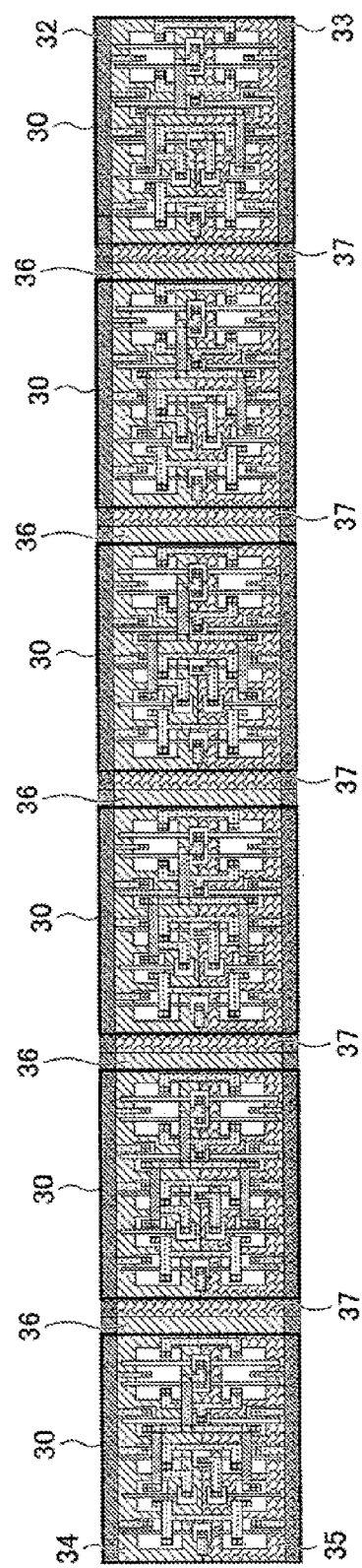
FIG. 5 is a drawing illustrating an example of the layout of a semiconductor integrated circuit implemented by use of the cell placement structure illustrated in FIG. 3 and the latch circuit configuration illustrated in FIG. 4.

FIG. 5 is a drawing illustrating an example of the layout of a semiconductor integrated circuit implemented by use of the cell placement structure illustrated in FIG. 3 and the latch circuit configuration illustrated in FIG. 4. In FIG. 5, the same or corresponding elements as those of FIG. 3 are referred to by the same or corresponding numerals, and a description thereof will be omitted as appropriate. In FIG. 5, the six memory cells (latches) 30 are arranged in line, with the N well 36 and the P well 37 inserted between adjacent latches 30.

Figure 6:
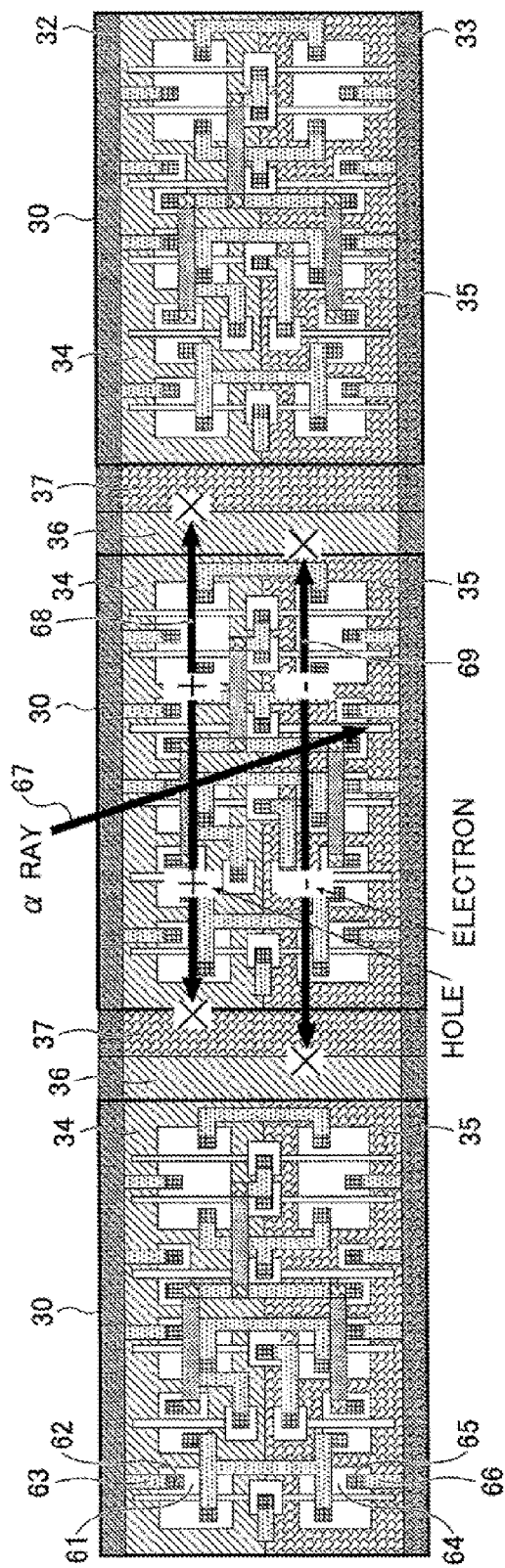
FIG. 6 is a drawing providing an enlarged view of three consecutive latches among the memory cells 30 illustrated in FIG. 5.

FIG. 6 is a drawing providing an enlarged view of three consecutive latches 30 among the memory cells 30 illustrated in FIG. 5. The latches 30 are arranged in line, with the N well 36 and the P well 37 inserted between adjacent latches 30. Each latch 30 is formed on the N well 34 and the P well 35. As illustrated in the leftmost latch 30 as an example, a P-type diffusion region 61 formed in the N well 34 is coupled to the Vdd line 32 through a contact 62 and a metal line 63. This P-type diffusion region 61 corresponds to the Vdd-side diffusion region of the PMOS transistor 42 illustrated in FIG. 4. Further, an N-type diffusion region 64 formed in the P well 35 is coupled to the Gnd line 33 through a contact 65 and a metal line 66. This N-type diffusion region 64 corresponds to the Gnd-side diffusion region of the NMOS transistor 48 illustrated in FIG. 4.

Upon entry of α ray into the P well 35 as illustrated by an arrow 67, a large number of generated electrons are scattered in every direction. The movement of electrons traveling in the P well 35 in the direction illustrated by an arrow 69 is stopped at the borders between the P well 35 and the N wells 36 that are situated on both sides of the latch 30. It follows that the probability of electrons entering the P wells 35 of the adjacent latches 30 is small. Similarly, upon entry of α ray into the N well 34, a large number of generated holes are scattered in every direction. The movement of holes traveling in the N well 34 in the direction illustrated by an arrow 68 is stopped at the borders between the N well 34 and the P wells 37 that are situated on both sides of the latch 30. It follows that the probability of holes entering the N wells 34 of the adjacent latches 30 is small. Accordingly, even if the value of one bit is inverted by soft error, the value of an adjacent bit is not inverted, thereby preventing the occurrence of plural-bit soft errors.

Figure 7:
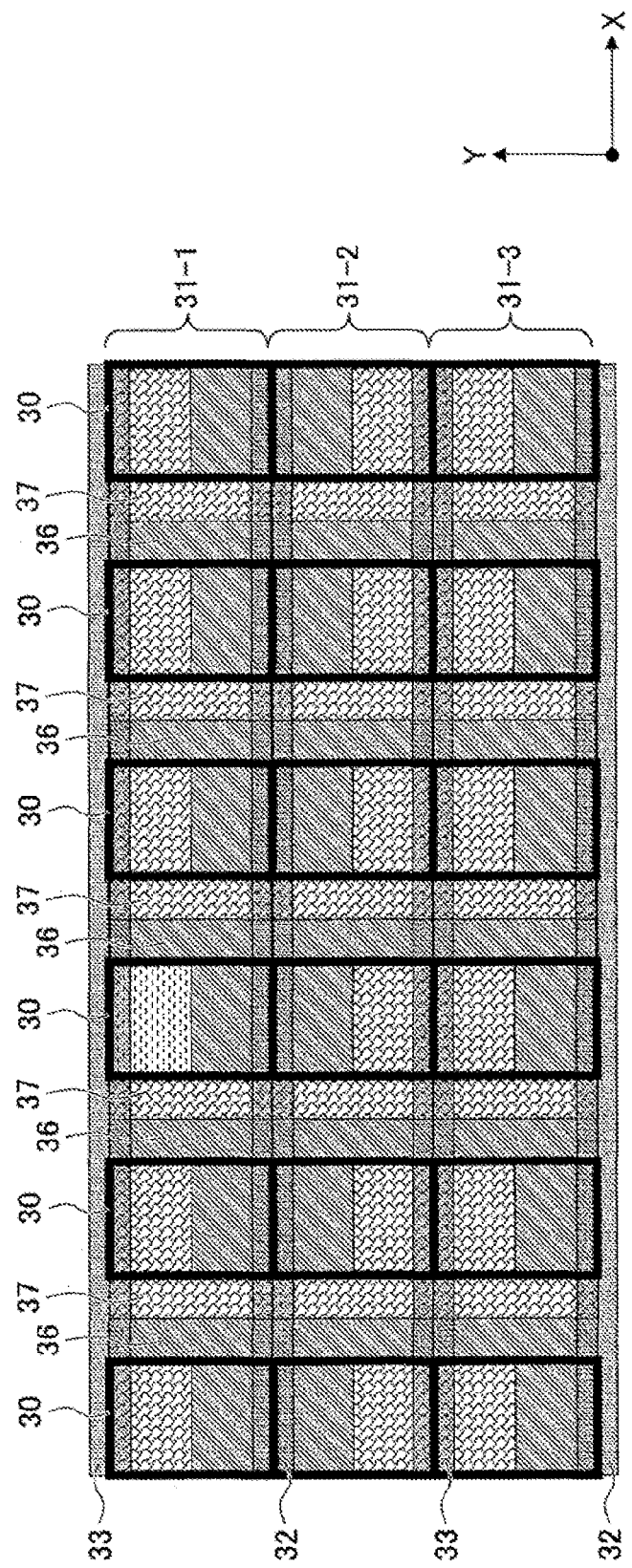
FIG. 7 is a drawing illustrating an example of the configuration of a plurality of cell-placement rows to which the cell placement structure illustrated in FIG. 3 is applied.

FIG. 7 is a drawing illustrating an example of the configuration of a plurality of cell-placement rows to which the cell placement structure illustrated in FIG. 3 is applied. In FIG. 7, the same or corresponding elements as those of FIG. 3 are referred to by the same or corresponding numerals, and a description thereof will be omitted as appropriate. In FIG. 7, Vdd lines 32 extending in the X direction for supplying the power supply potential Vdd and Gnd lines 33 extending in the X direction for supplying the ground potential Gnd are arranged alternately in the Y direction at constant intervals. Areas between the Vdd lines 32 and the Gnd lines 33 constitute cell-placement rows 31-1 through 31-3 having a constant height (and width). Namely, the three cell-placement rows 31-1 through 31-3 are disposed side by side in the Y direction.

As illustrated by reference numbers used with respect to the cell-placement row 31-1 as a representative, each of the cell-placement rows 31-1 through 31-3 extending in the X direction has a plurality of memory cells 30 arranged therein. In each area of the memory cells 30, an N well and a P well are arranged in the Y direction. Between two memory cells 30 adjacent to each other in the X direction, a N well 36 and a P well 37 each having the same length as the width of the cell-placement row are inserted.

The memory cells 30 provided in the cell-placement row 31-1 store respective bits (which may include a parity bit or one or more redundant bits) of one data item. The memory cells 30 provided in the cell-placement row 31-2 store respective bits (which may include a parity bit or one or more redundant bits) of another data item. Moreover, the memory cells 30 provided in the cell-placement row 31-3 store respective bits (which may include a parity bit or one or more redundant bits) of yet another data item.

In the cell placement structure illustrated in FIG. 7, the positions in the X-direction of the N wells 36 and the P wells 37 are aligned between different cell-placement rows. Namely, the N wells 36 and the P wells 37 hold the same positions in the X direction in the cell-placement rows 31-1 through 31-3. As a result, the N wells 36 and the P wells 37 provided in the cell-placement row 31-1 are integral and continuous with the N wells 36 and the P wells 37, respectively, provided in the cell-placement row 31-2, and are further integral and continuous with the N wells 36 and the P wells 37, respectively, provided in the cell-placement row 31-3. This serves to simplify the structure of wells.

Since the N wells 36 and the P wells 37 are continuous in the Y direction across the three cell-placement rows 31-1 through 31-3, it may be possible that soft error generated in a given cell-placement row travels to another cell-placement row. Namely, the occurrence of soft error in one memory cell 30 of the cell-placement row 31-1 may be accompanied the occurrence of soft error in the memory cells 30 in the same X direction in the remaining cell-placement rows 31-2 and 31-3. However, only 1-bit soft error occurs in the plurality of bits of a single cell-placement row that stores one data item, so that such an error can be properly dealt with by a parity check or error correction.

Figure 8:
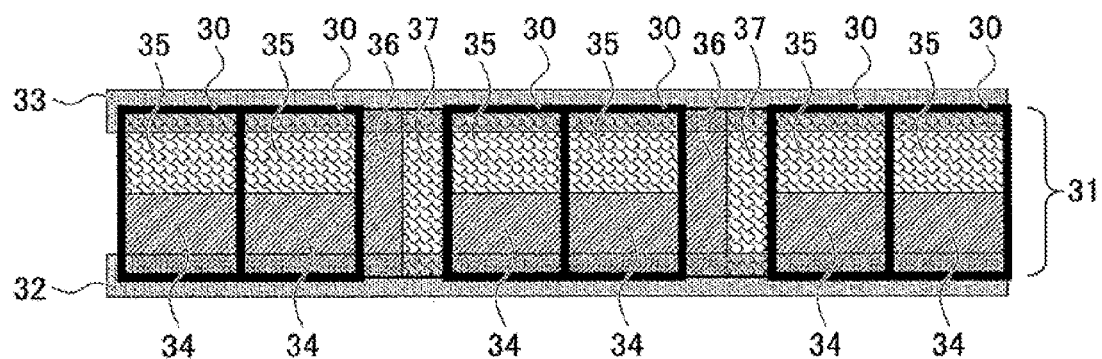
FIG. 8 is a drawing illustrating a variation of the configuration of the cell-placement structure.

FIG. 8 is a drawing illustrating a variation of the configuration of the cell-placement structure. In FIG. 8, the same or corresponding elements as those of FIG. 3 are referred to by the same or corresponding numerals, and a description thereof will be omitted as appropriate. In FIG. 8, between at least two adjacent memory cells of the plurality of memory cells 30, an N well 36 and a P well 37 each having the same length as the width of the cell-placement row 31 are inserted. The N wells 34 and the N well 36 illustrated as being adjacent to each other constitute an integrated, unitary, continuous well region. The P wells 35 and the P well 37 illustrated as being adjacent to each other constitute an integrated, unitary, continuous well region.

In the configuration illustrated in FIG. 8, pairs of N wells 36 and P wells 37 are situated at intervals of two or more memory cells 30, which differs from the configuration illustrated in FIG. 3. In the example illustrated in FIG. 8, pairs of N wells 36 and P wells 37 are situated at intervals of two memory cells 30. Two adjacent memory cells 30 between which a pair of an N well 36 and a P well 37 is not situated have a continuous N well 34 and a continuous P well 35. A mechanism for detecting or correcting errors up to two bits may be employed. In such a case, soft error can be properly dealt with even if every two bits of memory cells 30 are put together, with isolations being provided at intervals of two bits as illustrated in FIG. 8. This configuration allows the number of N wells 36 and P wells 37 to be reduced, thereby reducing the circuit area size.

Figure 9:
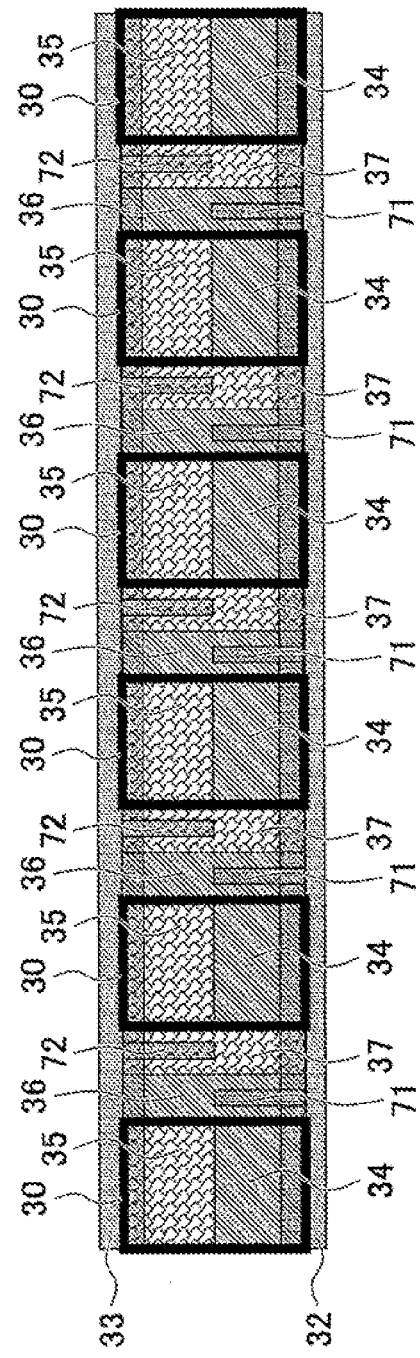
FIG. 9 is a drawing illustrating an example of the placement of potential contact parts for wells in the cell-placement structure.

FIG. 9 is a drawing illustrating an example of the placement of potential contact parts for wells in the cell-placement structure. In FIG. 9, the same or corresponding elements as those of FIG. 3 are referred to by the same or corresponding numerals, and a description thereof will be omitted as appropriate. In FIG. 9, each N well 36 has a potential contact part 71 for coupling the integrated N well 34 and 36 to the Vdd potential. Further, each P well 37 has a potential contact part 72 for coupling the integrated P well 35 and 37 to the Gnd potential. The potential contact part 71 in the N well 36 may include a contact and an N-type diffusion layer formed in the N well 36. The N-type diffusion layer in the N well 36 is coupled to the Vdd line 32 through the contact or through the contact and a metal line. The potential contact part 72 in the P well 37 may include a contact and a P-type diffusion layer formed in the P well 37. The P-type diffusion layer in the P well 37 is coupled to the Gnd line 33 through the contact or through the contact and a metal line.

Figure 2:
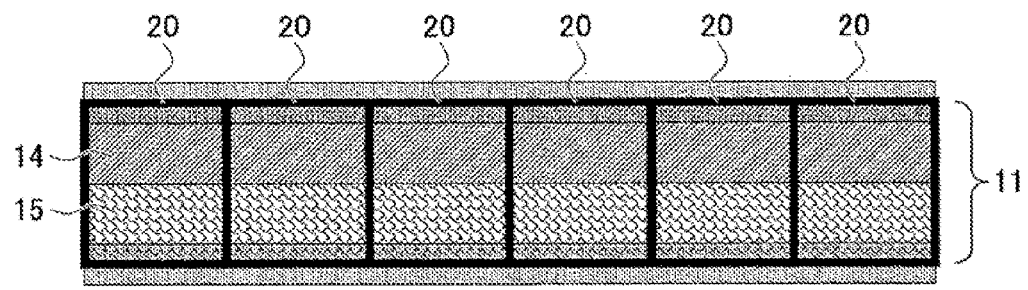
FIG. 2 is a drawing illustrating a configuration in which a plurality of latches for storing a plurality of bits are arranged in line on the cell-placement row.

When the N well 14 and the P well 15 which are shared by and continuous between cells are used as illustrated in FIG. 2, it suffices for each well to be coupled to a fixed potential at a single point in the cell-placement row 11 (e.g., at an end of the cell-placement row 11). In contrast, when the cell-placement structure illustrated in FIG. 3 is used, the N wells 34 and the P wells 35 of the memory cells 30 are not shared between the memory cells 30. In such a configuration, the wells of each memory cell 30 are coupled to respective fixed potentials. As illustrated in FIG. 9, the areas of the N wells 36 and the P wells 37 situated between the memory cells 30 are utilized to provide potential contact parts (i.e., well-tap parts) for connection to respective fixed potentials. This arrangement eliminates the need for well-tap parts to be provided in the areas of the memory cells 30. Accordingly, the memory cells 30 can be used in the cell placement structure of the present disclosure without any modification to the existing cell design thereof.

Figure 10:
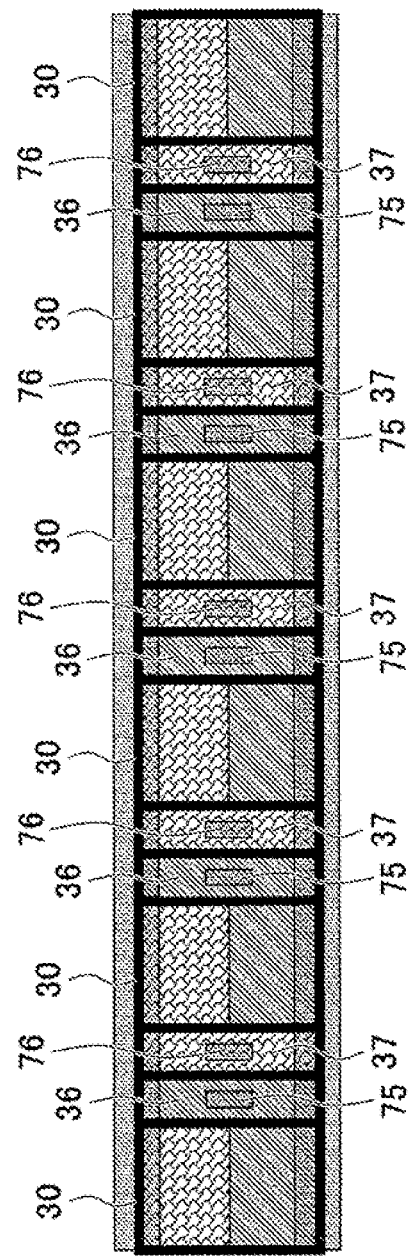
FIG. 10 is a drawing illustrating an example of a configuration in which inserted N wells and P wells are utilized as transistor forming areas.

FIG. 10 is a drawing illustrating an example of a configuration in which inserted N wells and P wells are utilized as transistor forming areas. In FIG. 10, the same or corresponding elements as those of FIG. 3 are referred to by the same or corresponding numerals, and a description thereof will be omitted as appropriate. In FIG. 10, the N wells 36 and the P wells 37 which are inserted between the memory cells 30 are utilized as transistor forming areas. Specifically, transistors 75 are formed in the N wells 36, and transistors 76 are formed in the P wells 37. In the example illustrated in FIG. 10, a single transistor is formed in each well. This is not a limiting example. One or more transistors may be formed in selected wells, and no transistor may be formed in the remaining wells. Moreover, plural transistors may be formed in a single well. These transistors may be used as circuit elements that are not part of the memory cells 30. The use of the N wells 36 and the P wells 37 inserted between the memory cells 30 as transistor forming areas serves to make effective use of the extra circuit areas.

It may be noted that two or more configurations illustrated in FIG. 7 through FIG. 10 may be combined together. For example, the configurations illustrated in FIG. 8, FIG. 9, and FIG. 10 may be combined, so that the N wells 36 and the P wells 37 are situated at intervals of two memory cells 30, and potential coupling parts are provided in the N wells 36 and the P wells 37, with transistors being formed.

Figure 11:
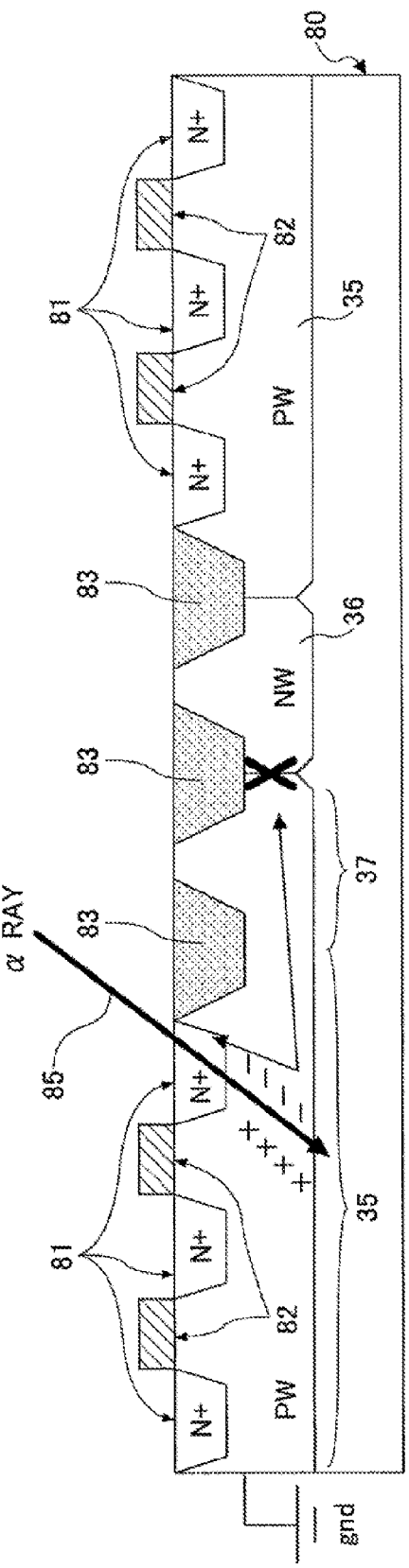
FIG. 11 is a cross-sectional view of a semiconductor integrated circuit having the cell placement structure illustrated in FIG. 3.

FIG. 11 is a cross-sectional view of a semiconductor integrated circuit having the cell placement structure illustrated in FIG. 3. In FIG. 11, the same or corresponding elements as those of FIG. 3 are referred to by the same or corresponding numerals, and a description thereof will be omitted as appropriate. FIG. 11 illustrates part of a cross-sectional view that is taken along the X direction at the position of the P well 35 illustrated in FIG. 3. P wells 35, an N well 36, and a P well 37 are formed in a substrate 80. One P well 35 and the P well 37 constitute an integrated, continuous well. A plurality of N-type diffusion layers 81 are formed in the P well 35. Gates 82 are formed over channels situated between the N-type diffusion layers 81. STIs (shallow trench isolations) 83 are formed in the substrate surface for the purpose of insulation. In FIG. 11, even when a large number of electrons and holes are generated in a P well 35 by entry of α ray as illustrated by an arrow 85, the N well 36 prevents the movement of electric charge. The possibility of electric charge reaching the adjacent P well 35 is low.

Figure 12:
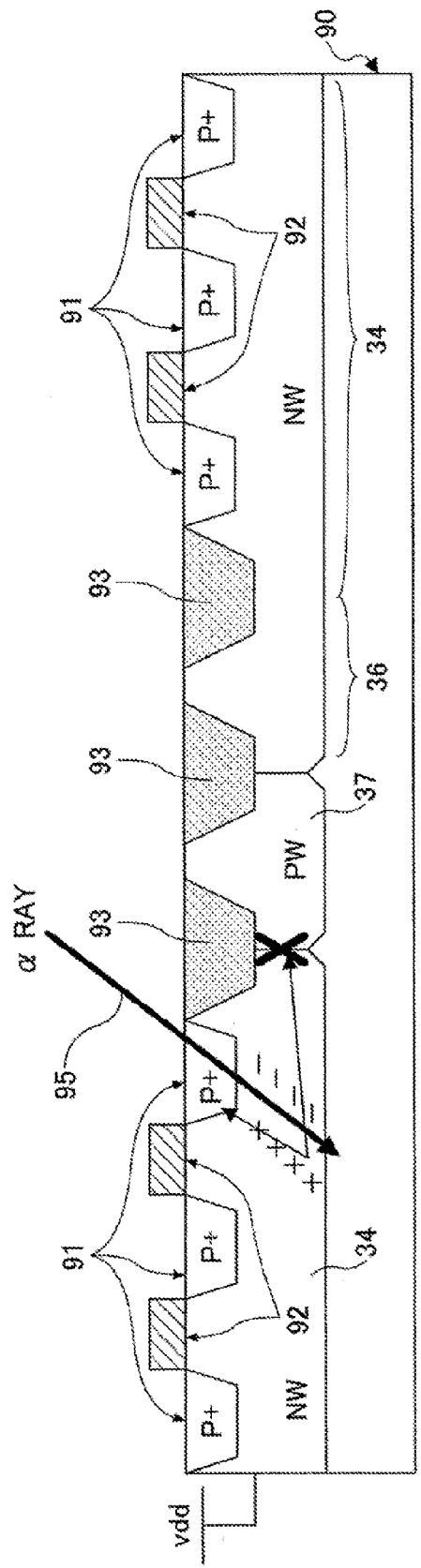
FIG. 12 is a cross-sectional view of a semiconductor integrated circuit having the cell placement structure illustrated in FIG. 3.

FIG. 12 is a cross-sectional view of a semiconductor integrated circuit having the cell placement structure illustrated in FIG. 3. In FIG. 12, the same or corresponding elements as those of FIG. 3 are referred to by the same or corresponding numerals, and a description thereof will be omitted as appropriate. FIG. 12 illustrates part of a cross-sectional view that is taken along the X direction at the position of the N well 34 illustrated in FIG. 3. N wells 34, an N well 36, and a P well 37 are formed in the substrate 90. One N well 34 and the N well 36 constitute an integrated, continuous well. A plurality of P-type diffusion layers 91 are formed in the N well 34. Gates 92 are formed over channels situated between the P-type diffusion layers 91. STIs (shallow trench isolations) 93 are formed in the substrate surface for the purpose of insulation. In FIG. 12, even when a large number of electrons and holes are generated in an N well 34 by entry of α ray as illustrated by an arrow 95, the P well 37 prevents the movement of electric charge. The possibility of electric charge reaching the adjacent N well 34 is low.

Figure 13:
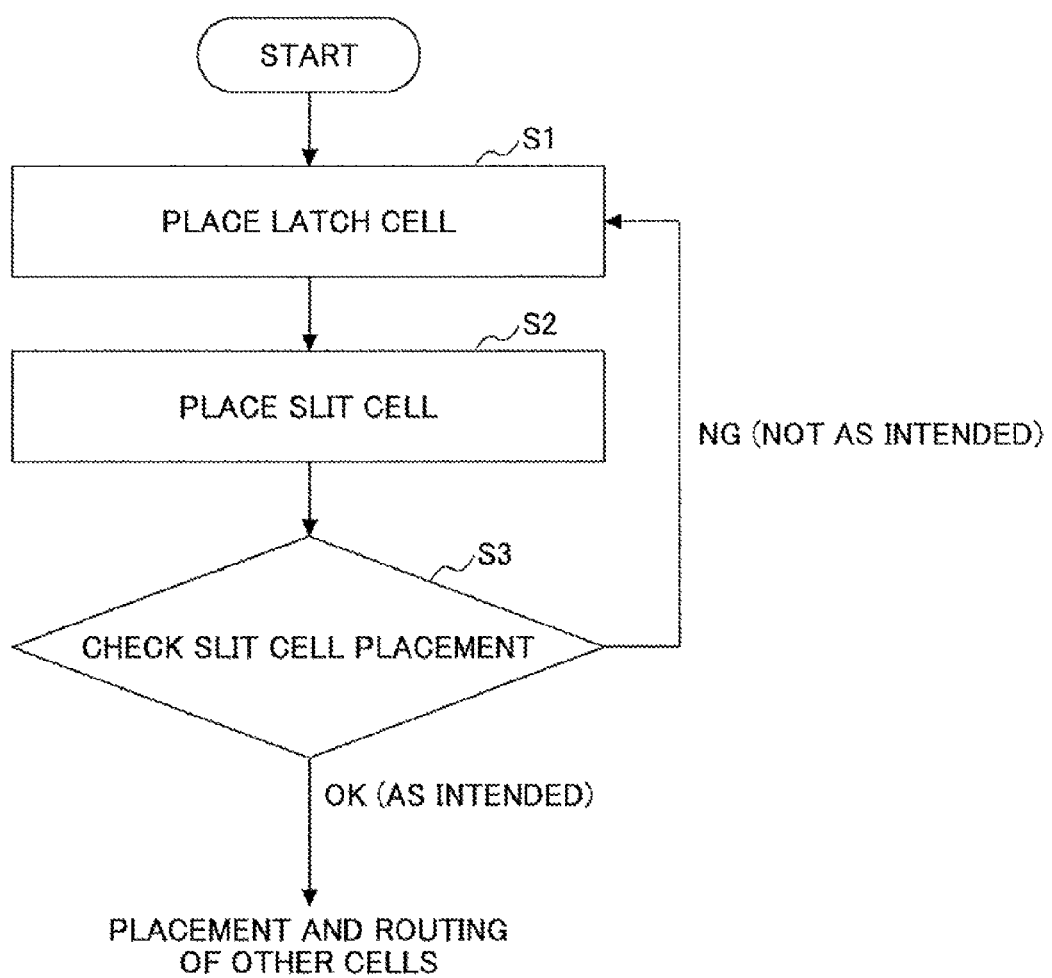
FIG. 13 is a drawing illustrating an example of a method of placing circuit element cells.

FIG. 13 is a drawing illustrating an example of a method of placing circuit element cells. In step S1, latch cells are placed. Namely, memory cells, each of which is formed in the first N well and the first P well arranged in the Y direction, are placed in a cell-placement row extending in the X direction. In step S2, one or more slit cells are placed. Namely, between at least two adjacent memory cells of the plurality of memory cells, a cell including a second N well and a second P well each having the same length as the width of the cell-placement row is disposed. The cell including the second N well and the second P well may have a slit shape having a length in the Y direction that is substantially longer than its width in the X direction.

In step S2, slit cell placement is placed. Namely, after one or more cells each including the second N well and the second P well are placed, a check is made as to whether the obtained placement conforms to the intended placement. If a problem is detected, the procedure returns to step S1, and continues therefrom. If the intended placement is obtained, a step of placing other cells and a further step of routing between the cells are performed. In this routing step, a potential contact part for coupling the first and second N wells to the Vdd potential may be formed in the second N well, and a potential contact part for coupling the first and second P wells to the Gnd potential may be formed in the second P well, thereby providing couplings to the respective potentials.

The placing of memory cells in step S1 and the placing of second N wells and second P wells in step S2 may be a single placing action that places these cells simultaneously as one standard cell. Namely, at least one memory cell and a pair of a second N well and a third P well adjacent thereto may be integrated, and may be placed at the same time as one standard cell.

Figure 14:
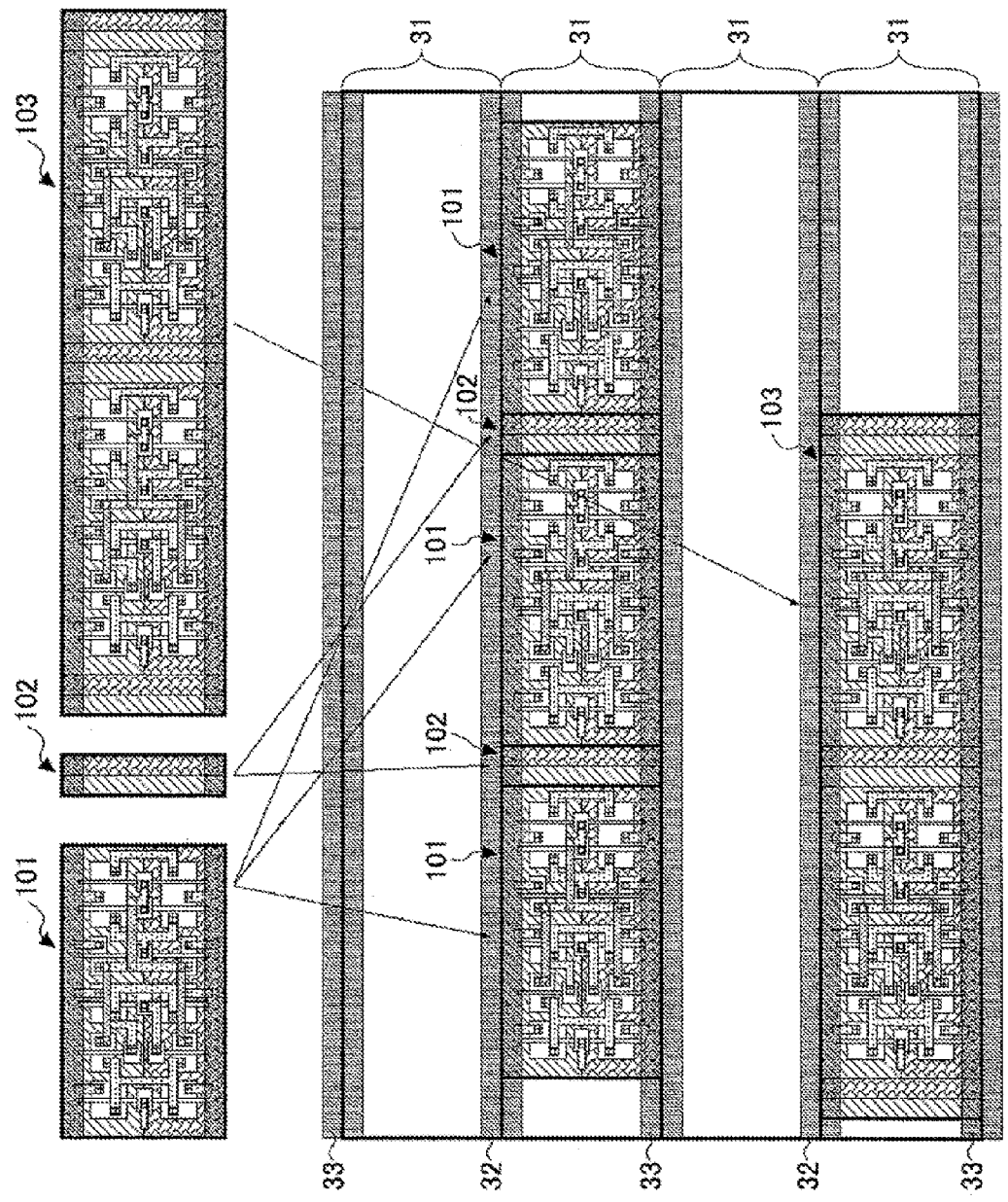
FIG. 14 is a drawing for explaining the process of placing circuit element cells.

FIG. 14 is a drawing for explaining the process of placing circuit element cells. In FIG. 14, the same or corresponding elements as those of FIG. 3 and FIG. 5 are referred to by the same or corresponding numerals, and a description thereof will be omitted as appropriate. In a standard-cell-placement area 10, Vdd lines 32 for supplying the power supply potential Vdd and Gnd lines 33 for supplying the ground potential Gnd are arranged alternately at constant intervals. An area between a Vdd line 32 and an adjacent Gnd line 33 constitutes a cell-placement row 31 having a constant height (and width). Circuit element cells 101, 102, and 103, which are standard cells prepared in advance, are to be placed in each cell-placement row 31.

The circuit element cell 101 corresponds to a memory cell 30 illustrated in FIG. 3 and FIG. 5. The circuit element cell 102 corresponds to an N well 36 and a P well 37 illustrated in FIG. 3 and FIG. 5. The circuit element cell 103 is a cell made by combining at least one memory cell 30 and one or more adjacent pairs of N wells 36 and P wells 37 illustrated in FIG. 3 and FIG. 5. In the example illustrated in FIG. 14, the circuit element cell 103 is a combined cell that includes two memory cells and three adjacent pairs of slit-shape N wells and P wells.

In the example illustrated in FIG. 14, three circuit element cells (memory cells) 101 are placed in the second cell-placement row 31 from the top, and, then, two circuit element cells (slit-shape well cells) 102 are placed therebetween. In this manner, the placing of memory cells in step S1 of FIG. 13 and the placing of second N wells and second P wells in step S2 may be performed as separate cell placement actions. In the fourth cell-placement row 31 illustrated in FIG. 14, one circuit element cell (memory cells and slit-shape well cells) 103 is placed. In this manner, the placing of memory cells in step S1 and the placing of second N wells and second P wells in step S2 may be a single placing action that places these cells simultaneously as one standard cell. Namely, at least one memory cell and a pair of a second N well and a third P well adjacent thereto may be integrated and treated as one standard cell, and may be placed at the same time.

FIG. 15 is a drawing illustrating the configuration of an apparatus for performing the method of placing circuit element cells.

As illustrated in FIG. 15, the apparatus for performing the method of placing circuit element cells is implemented as a computer such as a personal computer, an engineering workstation, or the like The apparatus of FIG. 15 includes a computer 510, a display apparatus 520 connected to the computer 510, a communication apparatus 523, and an input apparatus. The input apparatus includes a keyboard 521 and a mouse 522. The computer 510 includes a CPU 511, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to communicate with the computer 510. The communication apparatus 523 provides for communication to be conduced with a remote site, and may include a modem, a network interface, or the like.

The method of placing circuit element cells is provided as a computer program executable by the computer 510 and circuit element cell data usable by the computer program. This computer program and circuit element cell data are stored in a memory medium M that is mountable to the removable-medium storage device 515. The computer program and circuit element cell data are loaded to the RAM 512 or to the secondary storage device 514 from the memory medium M through the removable-medium storage device 515. Alternatively, the computer program and the circuit element cell data may be stored in a remote memory medium (not shown), and may be loaded to the RAM 512 or to the secondary storage device 514 from the remote memory medium through the communication apparatus 523 and the interface 516.

Upon user instruction for program execution entered through the keyboard 521 and/or the mouse 522, the CPU 511 loads the program to the RAM 512 from the memory medium M, the remote memory medium, or the secondary storage device 514. The CPU 511 executes the program loaded to the RAM 512 by use of an available memory space of the RAM 512 as a work area, and continues processing while communicating with the user as such a need arises. The ROM 513 stores therein control programs for the purpose of controlling basic operations of the computer 510.

With the computer program of the method of placing circuit element cells being executed, the user uses the computer 510 to place circuit element cells by use of the circuit element cell data including standard cells. For example, the computer 510 displays a standard-cell placement area including a plurality of cell-placement rows on the display apparatus 520, and also displays a message that requests the user to specify the types and positions of circuit element cells. When the user places a memory cell, for example, the CPU 511 executing the program may display a message requesting the placement of slit-shape well cells according to need. When the circuit element cell 103 illustrated in FIG. 14 is placed, for example, such a message that requests the placement of slit-shape well cells is not displayed upon this cell placement action.

Further, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor integrated circuit comprising:
   a plurality of memory cells each configured to store one bit of data and arranged in a line in a cell-placement row extending in a first direction;
   a first N well and a first P well disposed in each of the memory cells and being next to each other in a second direction perpendicular to the first direction; and
   a second N well and a second P well each having the same length as a width in the second direction of the cell-placement row and situated between two memory cells of the plurality of memory cells, the two memory cells being adjacent to each other with no memory cell placed therebetween,
   wherein a first N well and the second N well are continuous with each other, and a first P well and the second P well are continuous with each other.

2. The semiconductor integrated circuit as claimed in claim 1, wherein
   a potential contact part for coupling the continuous first and second N wells to a first potential is provided in the second N well, and a potential contact part for coupling the continuous first and second P wells to a second potential is provided in the second P well.

3. The semiconductor integrated circuit as claimed in claim 1, wherein a transistor is provided in at least one of the second N well and the second P well.

4. The semiconductor integrated circuit as claimed in claim 1, wherein a pair of the second N well and the second P well is situated at each of a plurality of locations that are spaced at intervals of two or more memory cells.

5. A semiconductor integrated circuit comprising:
a plurality of memory elements each configured to store one bit of data and arranged in a line in a cell-placement row extending in a first direction and formed in a first N well and a first P well arranged next to each other in a second direction perpendicular to the first direction; and
a second N well and a second P well each having the same length as a width in the second direction of the cell-placement row and situated between two memory elements of the plurality of memory elements, the two memory elements being adjacent to each other with no memory elements placed therebetween,
wherein a first N well and the second N well are continuous with each other, and a first P well and the second P well are continuous with each other, and wherein the plurality of memory elements store respective bits of one data item.

6. The semiconductor integrated circuit as claimed in claim 5, wherein data stored in at least one of the memory elements is a value obtained from data stored in other ones of the memory elements.

7. The semiconductor integrated circuit as claimed in claim 5, wherein a potential contact part for coupling the continuous first and second N wells to a first potential is provided in the second N well, and a potential contact part for coupling the continuous first and second P wells to a second potential is provided in the second P well.

8. A method of placing circuit element cells by use of a computer, the method comprising:
placing a plurality of memory cells each configured to store one bit of data and arranged in a line in a cell-placement row extending in a first direction, the plurality of memory cells each comprising a first N well and a first P well arranged next to each other in a second direction perpendicular to the first direction; and
placing, between two memory cells of the plurality of memory cells, a cell including a second N well and a second P well each having the same length as a width in the second direction of the cell-placement row, the two memory cells being adjacent to each other with no memory cell placed therebetween, such that a first N well and the second N well are continuous with each other, and a first P well and the second P well are continuous with each other.

9. The method as claimed in claim 8, wherein at least one memory cell and a pair of the second N well and the second P well adjacent thereto are placed simultaneously as one standard cell.

10. The method as claimed in claim 8, further comprising providing, in the second N well, a potential contact part for coupling the first and second N wells to a first potential, and providing, in the second P well, a potential contact part for coupling the first and second P wells to a second potential.

* * * * *